US006821848B2

(12) United States Patent
Lazaroff et al.

(10) Patent No.: US 6,821,848 B2
(45) Date of Patent: Nov. 23, 2004

(54) TUNNEL-JUNCTION STRUCTURES AND METHODS

(75) Inventors: Dennis Lazaroff, Corvallis, OR (US); Kenneth M. Kramer, Corvallis, OR (US); James E. Ellenson, Corvallis, OR (US); Neal W. Meyer, Corvallis, OR (US); David Punsalan, Eugene, OR (US); Kurt Ulmer, Corvallis, OR (US); Peter Fricke, Corvallis, OR (US); Andrew Koll, Albany, OR (US); Andrew L. Van Brocklin, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 23 days.

(21) Appl. No.: 10/286,157

(22) Filed: Oct. 30, 2002

(65) Prior Publication Data

US 2003/0186468 A1 Oct. 2, 2003

Related U.S. Application Data

(63) Continuation-in-part of application No. 10/236,274, filed on Sep. 6, 2002, now Pat. No. 6,711,045, which is a continuation-in-part of application No. 10/116,497, filed on Apr. 2, 2002.

(51) Int. Cl.$^7$ .................................................. H01L 21/336
(52) U.S. Cl. ......................................... 438/263; 438/264
(58) Field of Search ..................................... 438/263, 264, 438/197, 259, 270, 381, 680, 681, 687, 688, 692

(56) References Cited

U.S. PATENT DOCUMENTS

| | | | | | |
|---|---|---|---|---|---|
| 5,150,019 | A | * | 9/1992 | Thomas et al. | 315/350 |
| 5,572,042 | A | * | 11/1996 | Thomas et al. | 257/10 |
| 5,713,774 | A | * | 2/1998 | Thomas et al. | 445/23 |

* cited by examiner

Primary Examiner—David Nhu

(57) ABSTRACT

Tunnel-junction structures are fabricated by any of a set of related methods that form two or more tunnel junctions simultaneously. The fabrication methods disclosed are compatible with conventional CMOS fabrication practices, including both single damascene and dual damascene processes. The simultaneously formed tunnel junctions may have different areas. In some embodiments, tub-well structures are formed with sloped sidewalls. In some embodiments, an oxide-metal-oxide film stack on the sidewall of a tub-well is etched to form the tunnel junctions. Memory circuits, other integrated circuit structures, substrates carrying microelectronics, and other electronic devices made by the methods are disclosed.

53 Claims, 17 Drawing Sheets

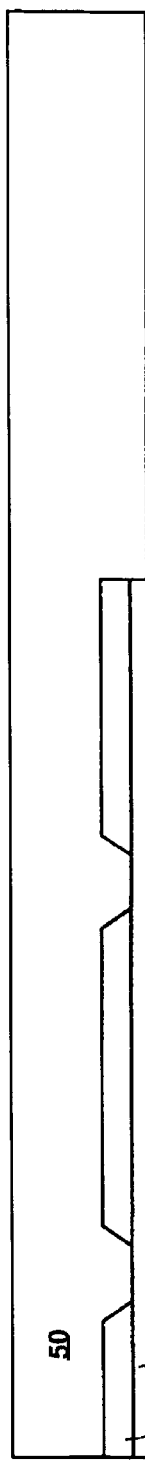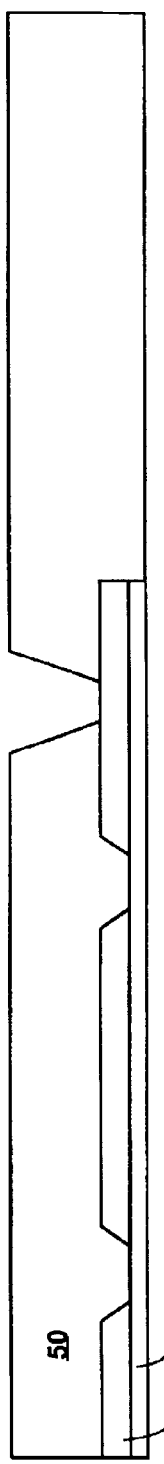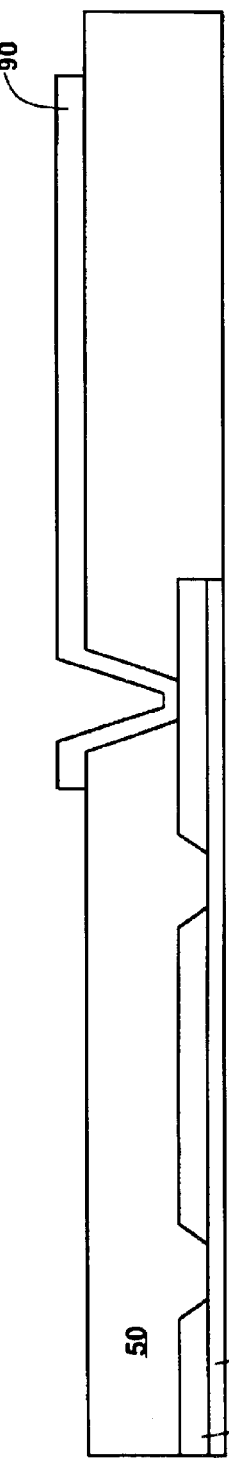

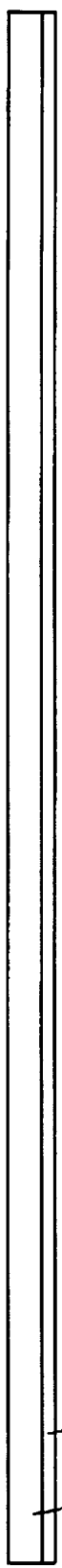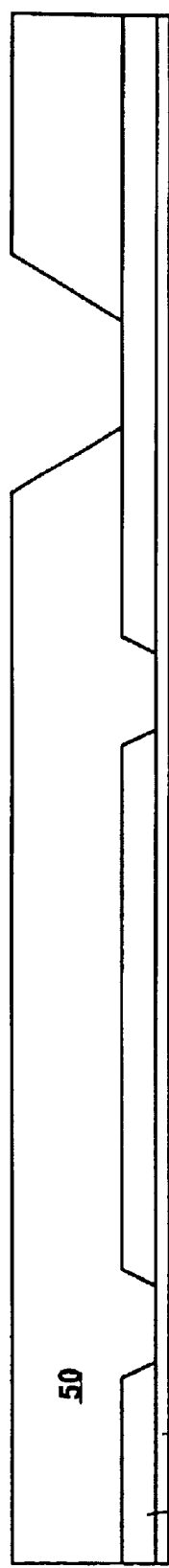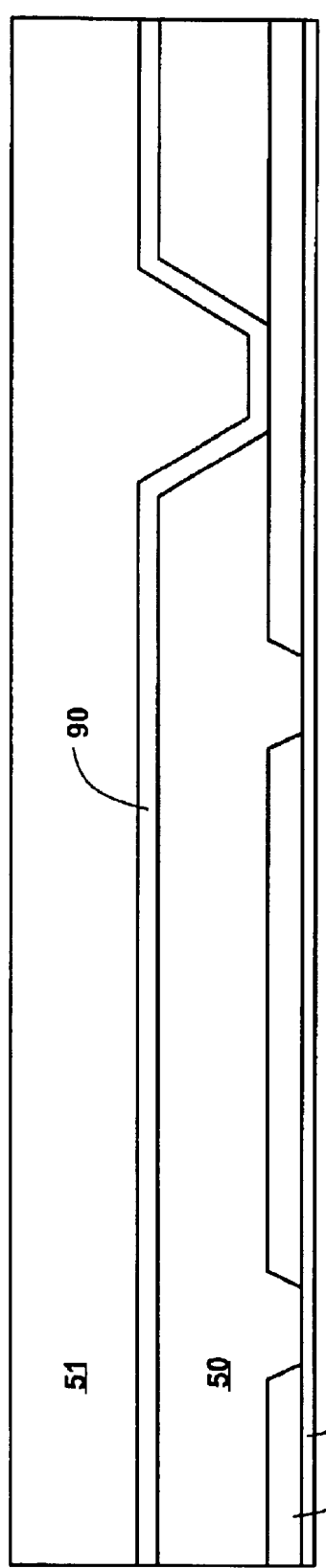

TUNNEL-JUNCTION STRUCTURES AND METHODS

CROSS-REFERENCE TO RELATED APPLICATIONS

This application is a continuation-in-part of commonly assigned application Ser. No. 10/236,274 filed Sep. 6, 2002, now U.S. Pat. No. 6,711,045 and is a continuation-in-part of co-pending and commonly assigned application Ser. No. 10/116,497 filed Apr. 2, 2002. The entire disclosure of each of these applications is incorporated herein by reference.

TECHNICAL FIELD

This invention relates to integrated circuits including memory structures and relates to methods for fabricating such integrated circuits and memory structures and, more particularly, relates to structures including tunnel junctions and methods for fabricating and using such tunnel-junction structures.

BACKGROUND

As computer and other electrical equipment prices continue to drop, the manufacturers of storage devices, such as memory devices and hard drives, are forced to lower the cost of their components. At the same time, markets for computers, video games, televisions and other electrical devices are requiring increasingly larger amounts of memory to store images, photographs, videos, movies, music, and other storage intensive data. Thus, besides reducing costs, manufacturers of storage devices must also increase the storage density of their devices. This trend of increasing memory storage density while reducing costs required to create the storage has been on-going for many years, and even optical storage such as CD-ROM, CD-R, CD-RIW, DVD, and DVD-R variants are being challenged by device size limitations and costs. There is accordingly a need for economical, high capacity memory structures and economical methods for fabricating such structures, especially methods that are compatible with methods used to fabricate other elements of integrated circuits.

BRIEF DESCRIPTION OF THE DRAWINGS

FIGS. 18A-18K are side elevation cross-sectional views of an embodiment structure at various stages of fabrication by the method embodiment of FIGS. 17A-17B.

FIGS. 20A-20F are side elevation cross-sectional views of an embodiment structure at various stages of fabrication by the method embodiment of FIG. 19.

FABRICATION METHODS

Figure 1:
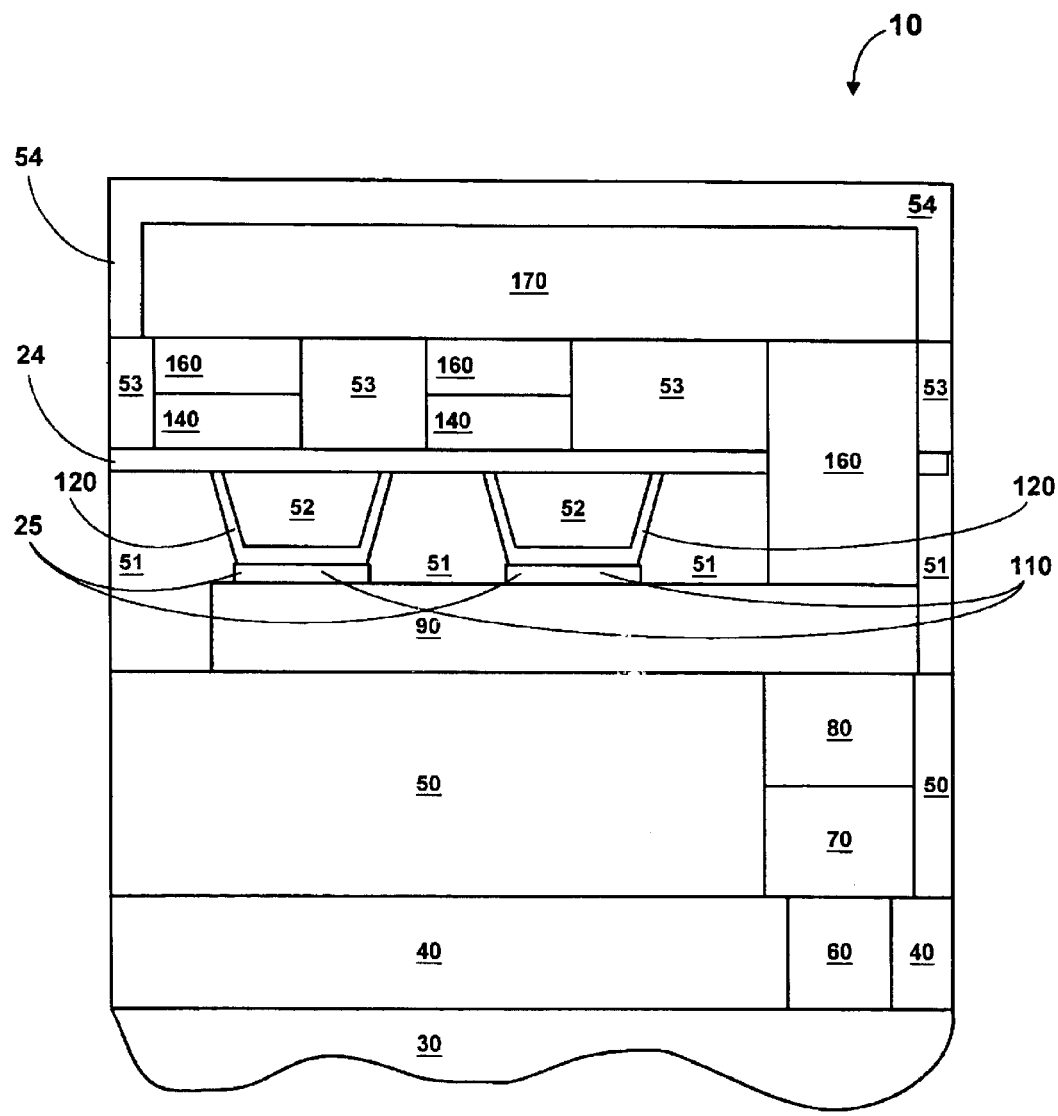
FIG. 1 is a side-elevation cross-sectional view of an embodiment of tunnel-junction structures made in accordance with the invention.

Examples of overall fabrication methods for structural embodiments of the invention are disclosed in the following detailed description, with reference first to drawing FIGS. 1-14. FIG. 1 shows a side-elevation cross-sectional view of an embodiment 10 of tunnel-junction structures made in accordance with the present invention. FIGS. 2-13 show side-elevation cross-sectional views of the embodiment 10 shown in FIG. 1, illustrating various stages of fabrication. For clarity of exposition, the drawings are not drawn to any uniform scale. In particular, vertical and horizontal scales ma differ.

By way of illustrative examples, the disclosed memory structures will be shown as integrated circuits that include an interlayer dielectric (ILD) that provides support and isolation between various structures of an integrated circuit. Such an interlayer dielectric may be composed of insulating materials such as silicon dioxide, silicon nitride, or TEOS (tetraethylorthosilicate), for example. The interlayer dielectric can be deposited using several different technologies such as chemical vapor deposition (CVD), atmospheric pressure CVD, low pressure CVD, plasma enhanced CVD, physical vapor deposition (PVD), sputtering, and evaporation. For convenience, regions and layers of such dielectric may be identified in the drawings by the reference designation ILD.

Figure 14:
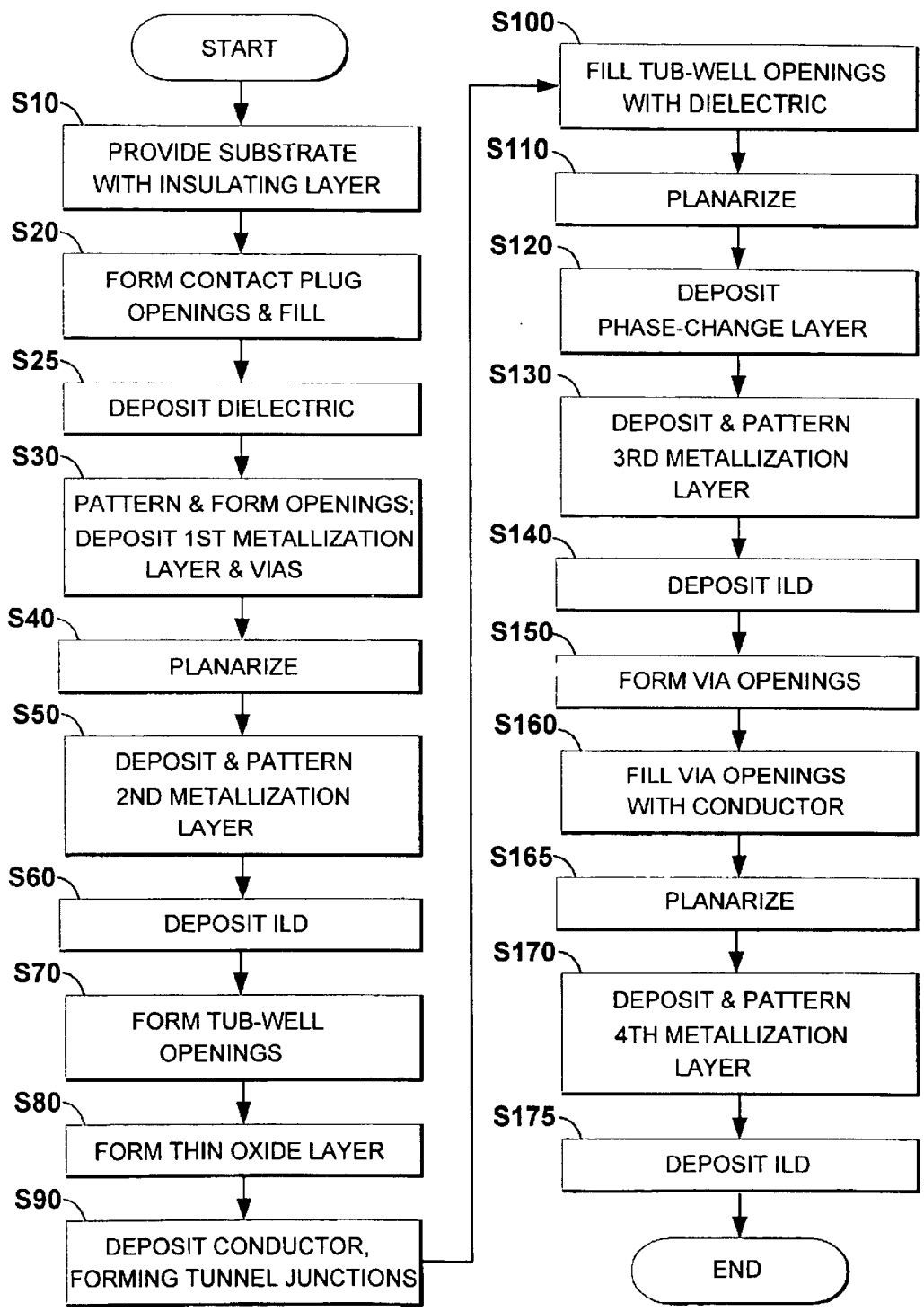
FIG. 14 is a flow diagram of an embodiment of a fabrication method performed in accordance with the invention.

FIG. 14 shows a flow diagram of an embodiment of a fabrication method performed in accordance with the invention. Various steps of the fabrication method embodiment are denoted by reference numerals S10, S20, . . . , S175. Conventional intermediate steps, e.g., for cleaning and/or inspection, are omitted for simplicity. A suitable substrate is provided (step S10), e.g., a flat silicon wafer 30 with a layer of insulator 40, such as silicon nitride, silicon oxide, borosilicate glass (BSG), phosphosilicate glass (PSG), borophosphosilicate glass (BPSG), or combinations of such layers, which may be recessed locally.

Openings are formed and filled (step S20) with a conductive material such as tungsten to form contact plugs 60. A layer of dielectric 50, such as silicon dioxide, is deposited (step S25), and openings are patterned and filled with suitable conductive materials such as aluminum-copper to form a first metallization layer 70 and tungsten 80 to form vias (step S30) through the interlayer dielectric (ILD) 50 in alignment with contact plugs 60. The various metallization layers, such as first metallization layer 70, may be any suitable conductive material, for example a metal deposited by chemical vapor deposition (CVD) or physical vapor deposition (PVD). It will be recognized by those skilled in the art that any of the metallization layers used in the methods disclosed herein, such as metallization layers 70, 90, 140, and 170, may be made by a damascene process or dual damascene process.

Figure 2:
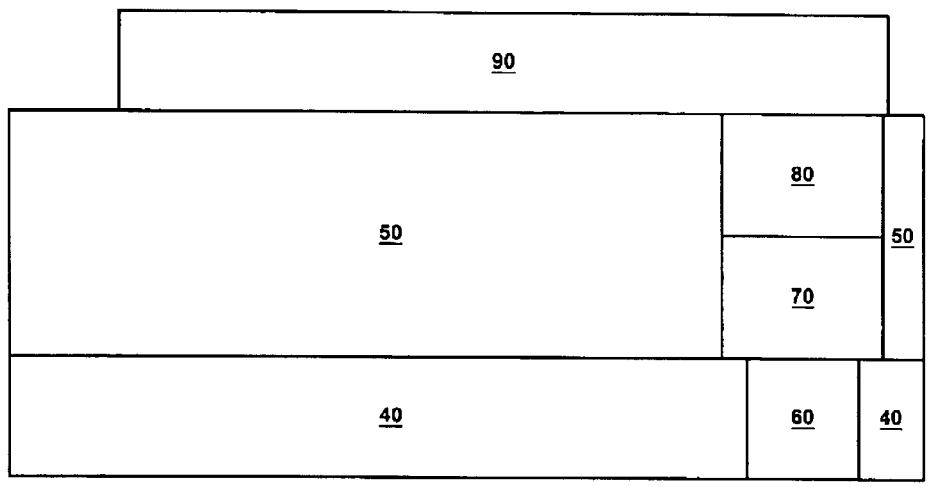
FIGS. 2-13 show side-elevation cross-sectional views of an embodiment at various stages of fabrication.
Figure 3:
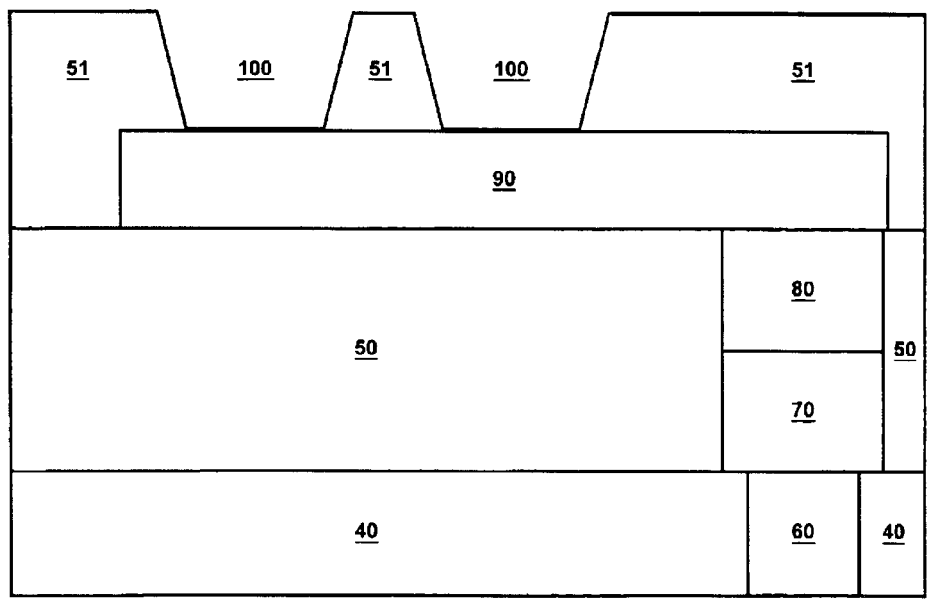
Figure 4:
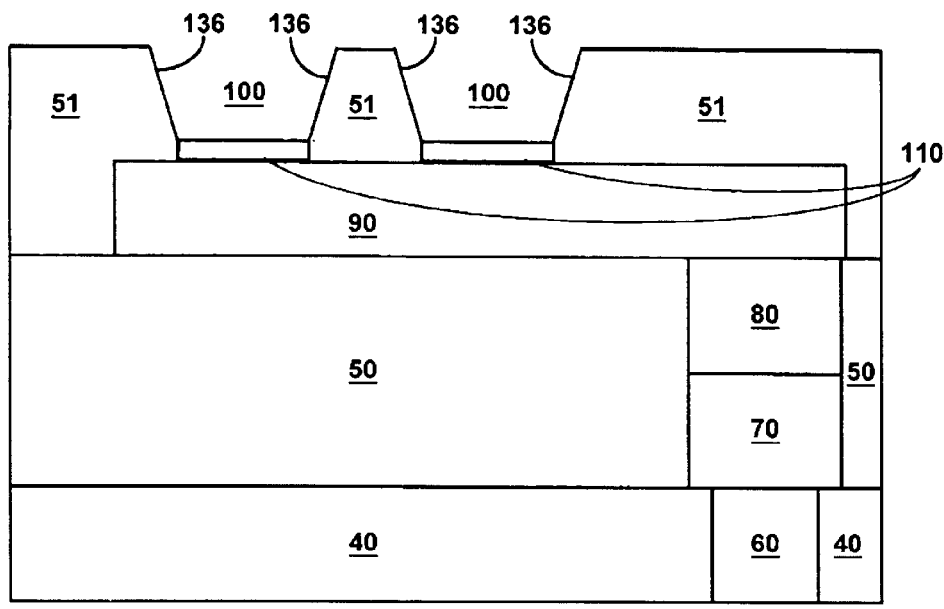
Figure 5:
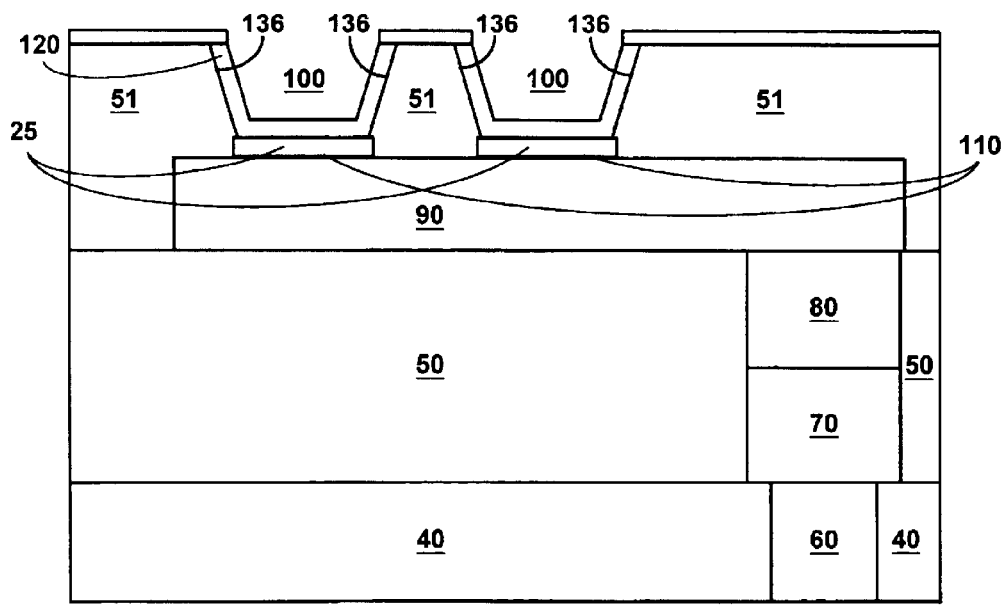
Figure 6:
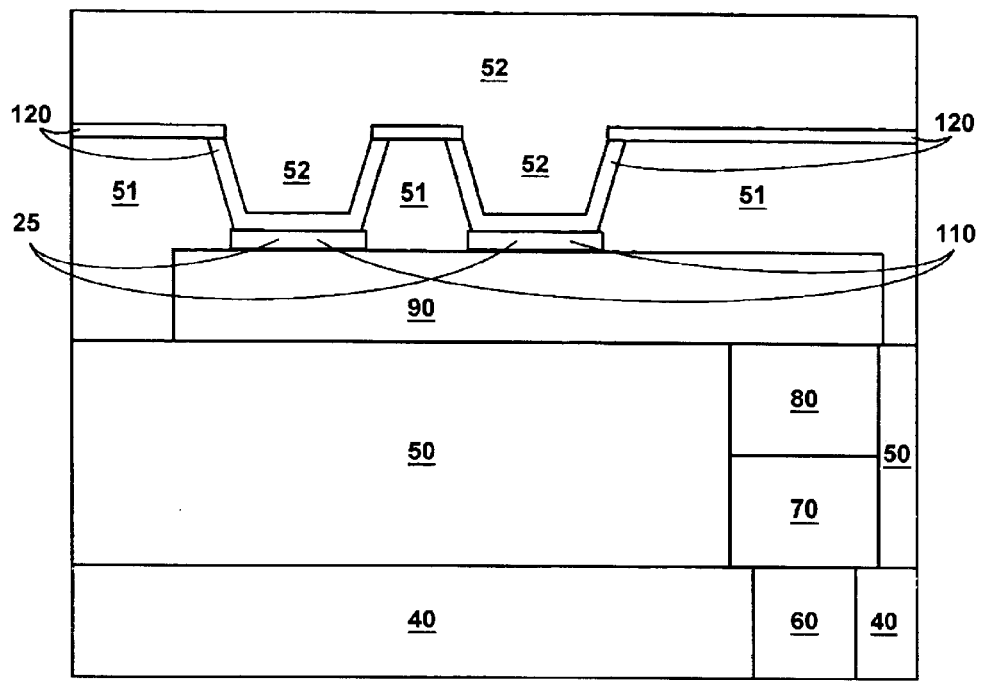

After planarization (step S40), a layer of conductive material such as aluminum-copper is deposited and patterned (step S50) to form a second metallization layer 90. FIG. 2 illustrates a cross-section of the structure at this stage. Another ILD 51 is deposited (step S60). Tub-well openings 100 are formed (step S70) by etching through ILD 51 down to second metallization layer 90, as shown in FIG. 3. In some embodiments, the patterning in step S50 may include off-setting the second metallization layer pattern of the second metallization aver 90 laterally with respect to openings 100. A thin oxide layer 110 is formed (step S80) over second metallization layer 90, covering the bottoms of tub-well openings 100.

A conductive material 120 is deposited to form a conformal layer over the tub-well side-walls 136 and over thin oxide layer 110, thus forming tunnel junctions 25 (step S90) at the bottoms of tub-well openings 100. The tunnel junction can be formed from oxidized metal, thermally grown oxide, or d posited oxides. Tunnel junction 25 will serve as control elements in the completed tunnel-junction structures. The memory storage element can be a portion of an unpatterned oxide layer that can be a deposited oxide layer or a completely oxidized deposited metal layer, for example. Similarly, the control-element tunnel junction 25 can be a portion of an unpatterned oxide layer that can be a deposited oxide layer of a completely oxidized deposited metal layer, for example.

Figure 7:
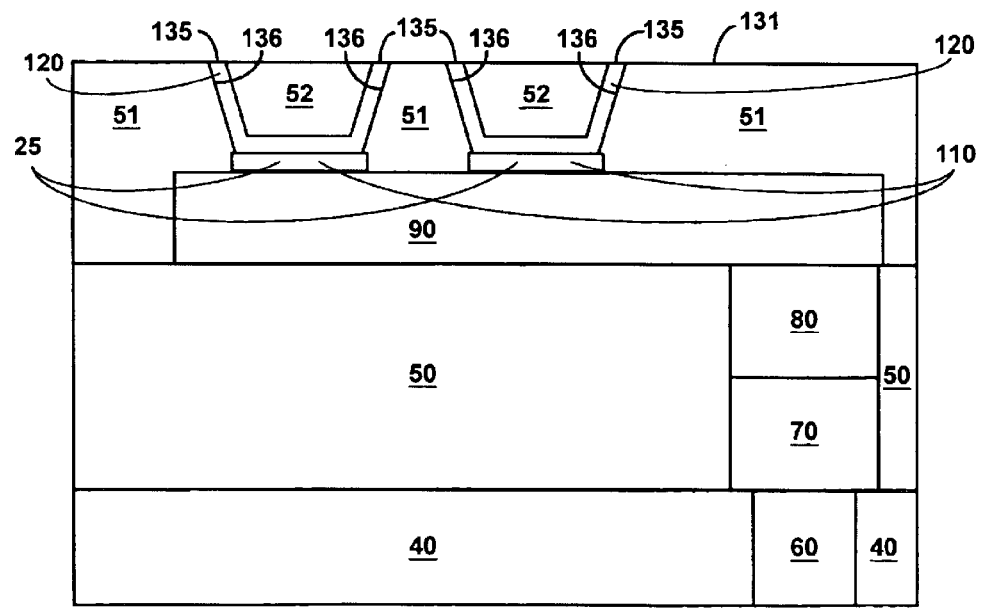
Figure 8:
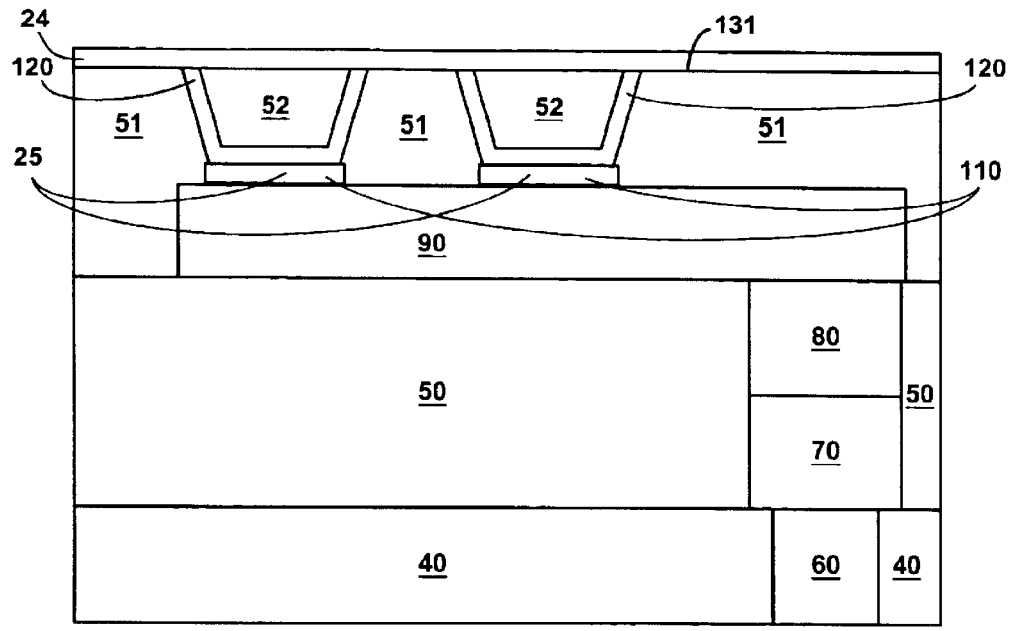
Figure 9:
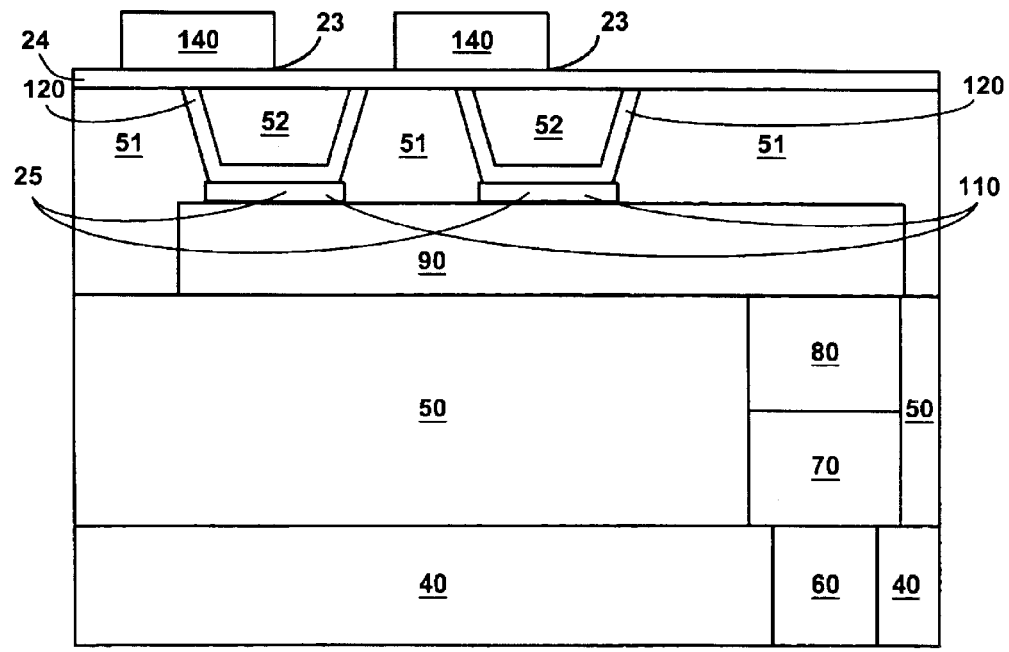
Figure 10:
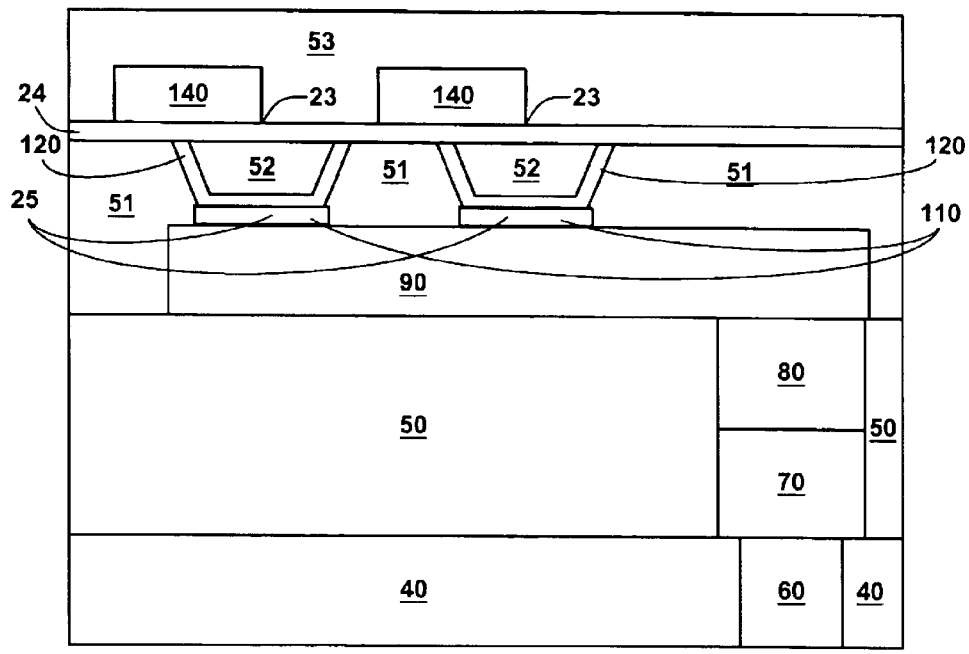
Figure 11:
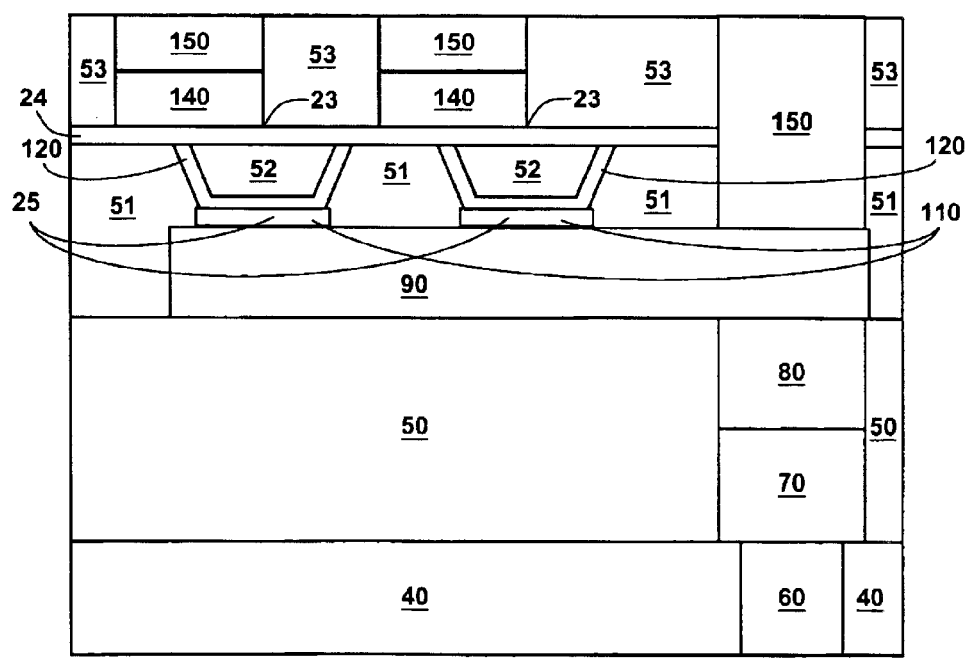
Figure 12:
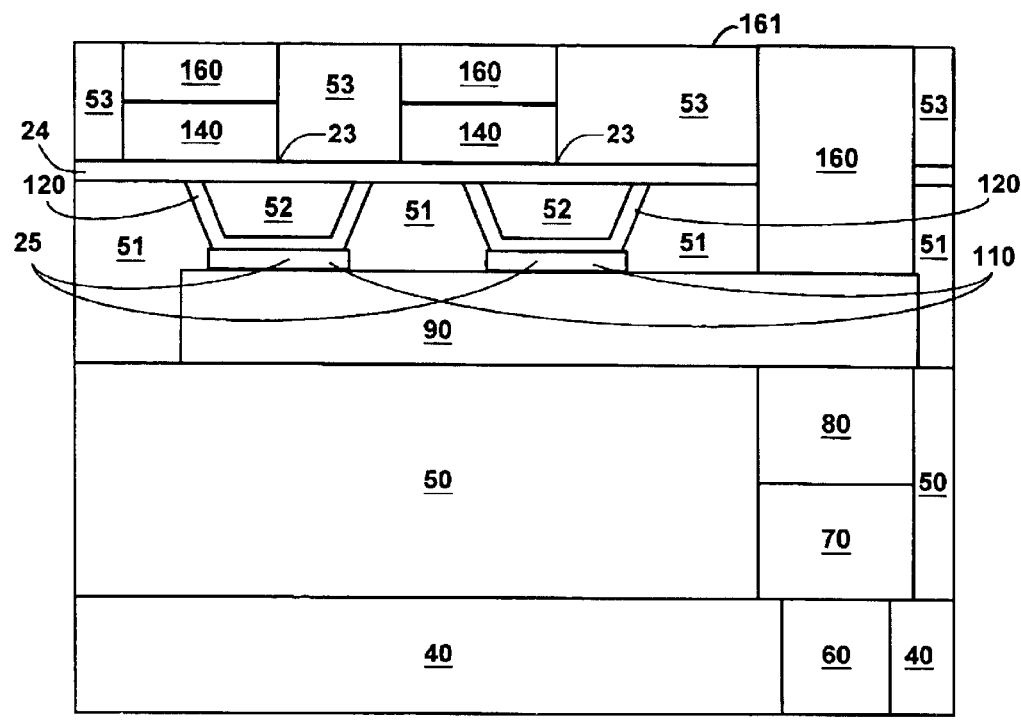
Figure 13:
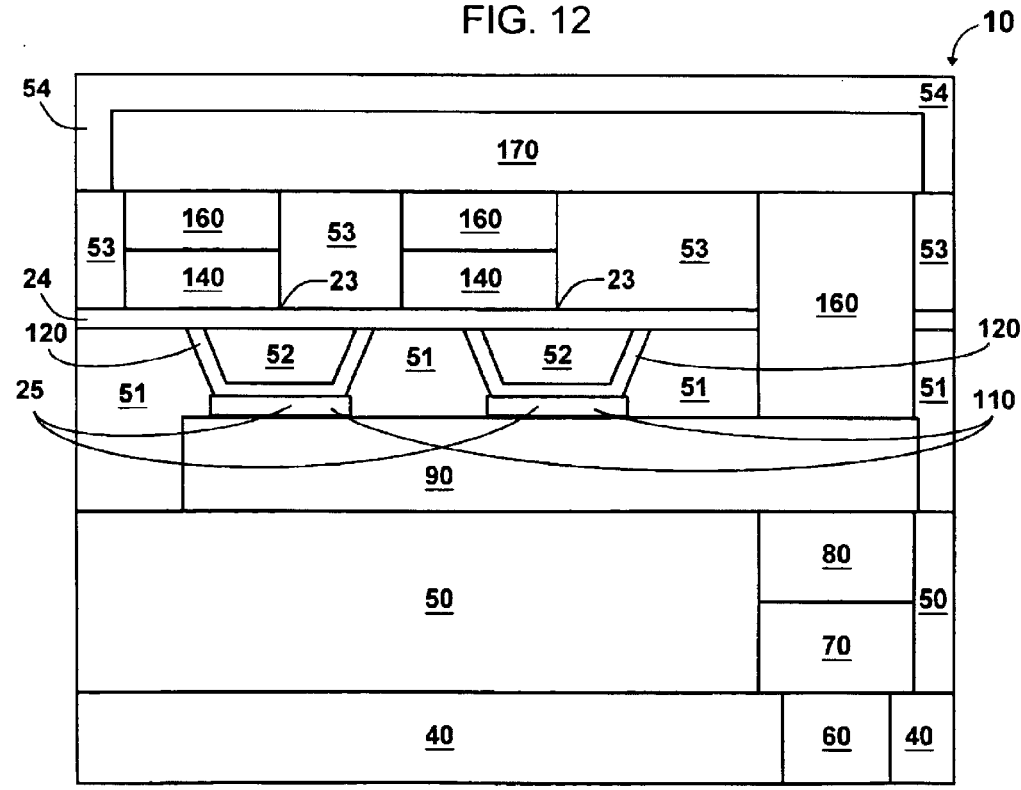

Tub-well openings 100 are filled (step S100) with a dielectric 52 (shown in FIG. 6), and the resultant surface is planarized (step S110) forming planar surface 131, as shown in FIG. 7. The planarization exposes rim edges 135 of conductive material 120 at the top of tub-well side-walls 136. A layer 24 of phase-change material is deposited (step S120) on planar surface 131 and in electrical contact with the rim edges 135 of conductive material 120, as shown in FIG. 8. Phase-change material layer 24 will serve as the storage element layer of the completed tunnel-junction structures. A third metallization layer (e.g. aluminum-copper) is deposited and patterned (step S130) to form top conductors 140, thus defining storage regions 23 in phase-change material layer 24, as shown in FIG. 9. Another ILD layer 53 is deposited (step S140), as shown in FIG. 10. Openings 150 are formed (step S150), extending down to third metallization layer conductors 140 and down to second metallization layer 90 respectively, as shown in FIG. 11. In some embodiments, the patterning in step S130 may include offsetting the third metallization layer pattern 140 of the third metallization lever laterally with respect to openings 150. Openings 150 are filled (step S160) with conductive material such as tungsten to form vias 160. The resulting surface is planarized (step S165) to form a planar surface 161, as shown in FIG. 12. A fourth metallization layer 170 (e.g. aluminum-copper) is deposited and patterned (step S170). Another ILD layer 54 is deposited over fourth metallization layer 170 (step 175), as shown in FIG. 13. This completes the tunnel-junction structure of FIG. 1.

When multiple layers are to be formed to make a multi-layer vertical memory structure, FIGS. 13 and 14 illustrate completion of one layer of the multi-layer vertical memory structure. If necessary, the ILD 54 deposited in step S175 may be planarized to form a planar surface (a step equivalent in some embodiments to step S10, providing a substrate 30) before beginning the next layer of the multi-layer vertical memory structure. Thus, after each successive layer of the multi-layer vertical memory structure is completed, steps S20-S175 are repeated to make the next layer. In principle, an unlimited number of layers may be stacked in this manner to form the multi-layer vertical memory structure.

Thus, a memory or storage device or other integrated circuit including such tunnel-junction structures may be made in accordance with the invention. An electronic device or a substrate carrying microelectronics that uses tunnel-junction structures may be made by the methods described above or by the various methods described hereinbelow.

Figure 15:
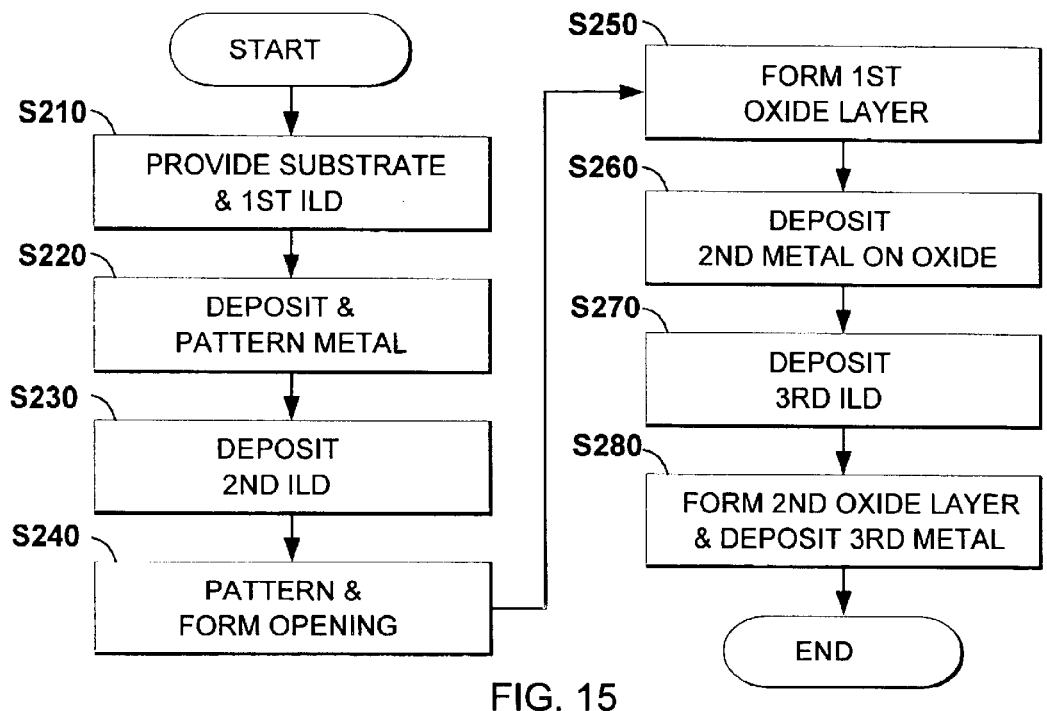
FIG. 15 is a flow diagram of a simple embodiment of a fabrication method performed in accordance with the invention.

FIG. 15 shows a flow diagram illustrating a simplified embodiment of a fabrication method performed in accordance with the invention. As shown in FIG. 15, this method comprises steps S210-S280, starting with providing a suitable substrate and depositing a first interlayer dielectric (ILD) (step 5210). The method continues with depositing and patterning a first metal (step S220), depositing a second ILD (step S230). patterning and forming an opening (step S240), forming a first oxide layer (step S250), depositing a second metal on the oxide (step S260), depositing a third ILD (step S270), and forming a second oxide layer and depositing a third metal (step S280). The tunnel junctions can be formed from oxidized metal, thermally grown oxide, or deposited oxides. The memory storage element can be a portion of an unpatterned oxide lever that can be a deposited oxide layer or a completely oxidized deposited metal layer, for example. Similarly, the control-element tunnel junction 25 can be a portion of an unpatterned oxide layer that can be a deposited oxide layer or a completely oxidized deposited metal layer, for example.

Figure 16:
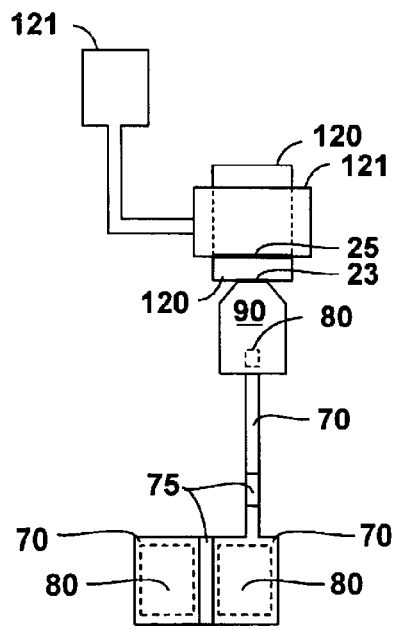
FIG. 16 is a top plan view of a double tunnel-junction structure embodiment made in accordance with the invention.

FIG. 16 shows a top plan view of a simple double tunnel-junction structure embodiment made by this method. Tunnel junctions 23 and 25 in FIG. 16 are formed on the sloped sidewalls of tub-wells 120 and 121. Metal-filled vias 80 provide for connections between first metallization layer 70 and second metallization layer 90. Resistive material 75 provides resistors in the circuit, as shown.

Figure 17A:
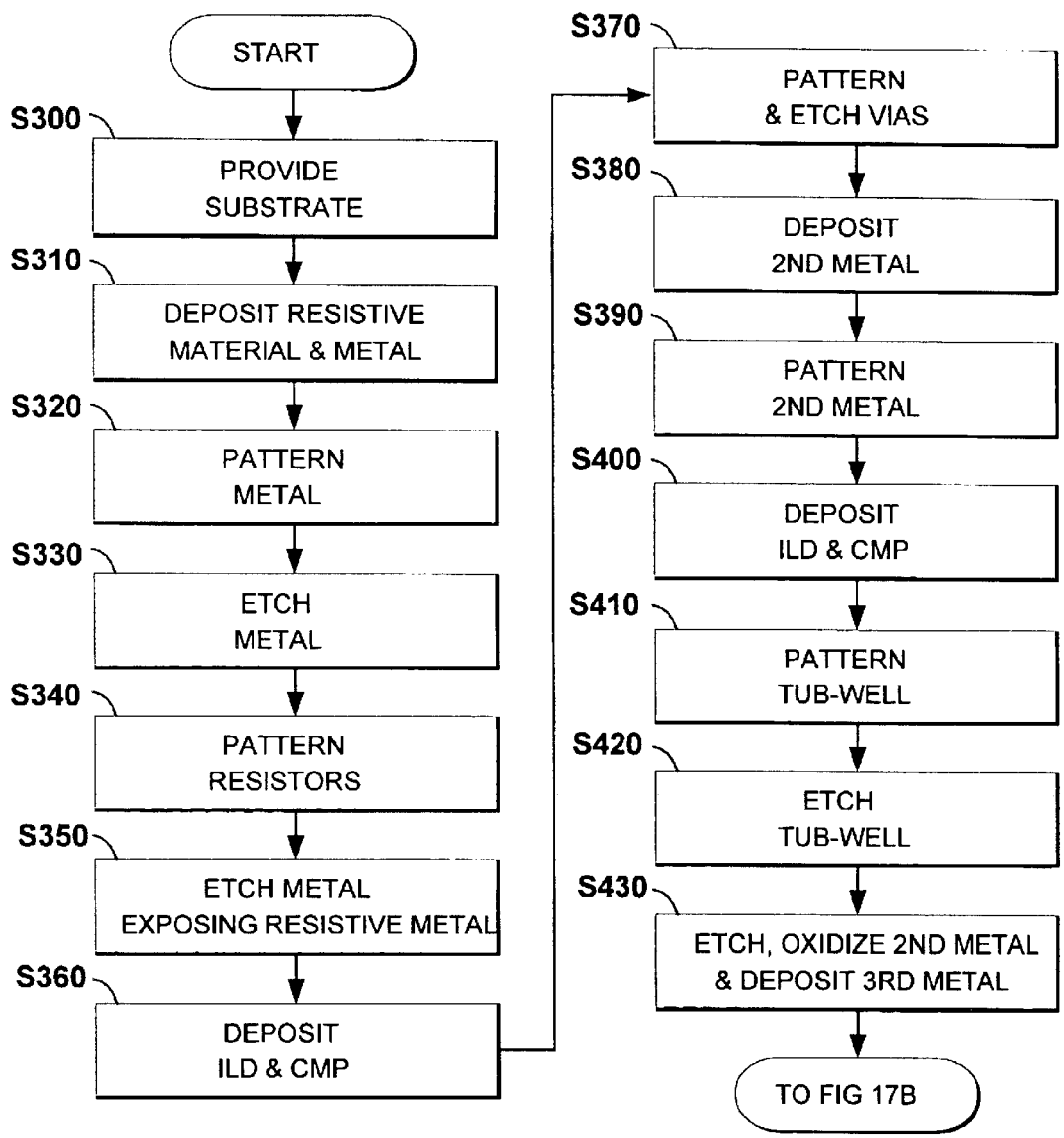
FIGS. 17A and 17B together illustrate another embodiment of a fabrication method performed in accordance with the invention.
Figure 17B:
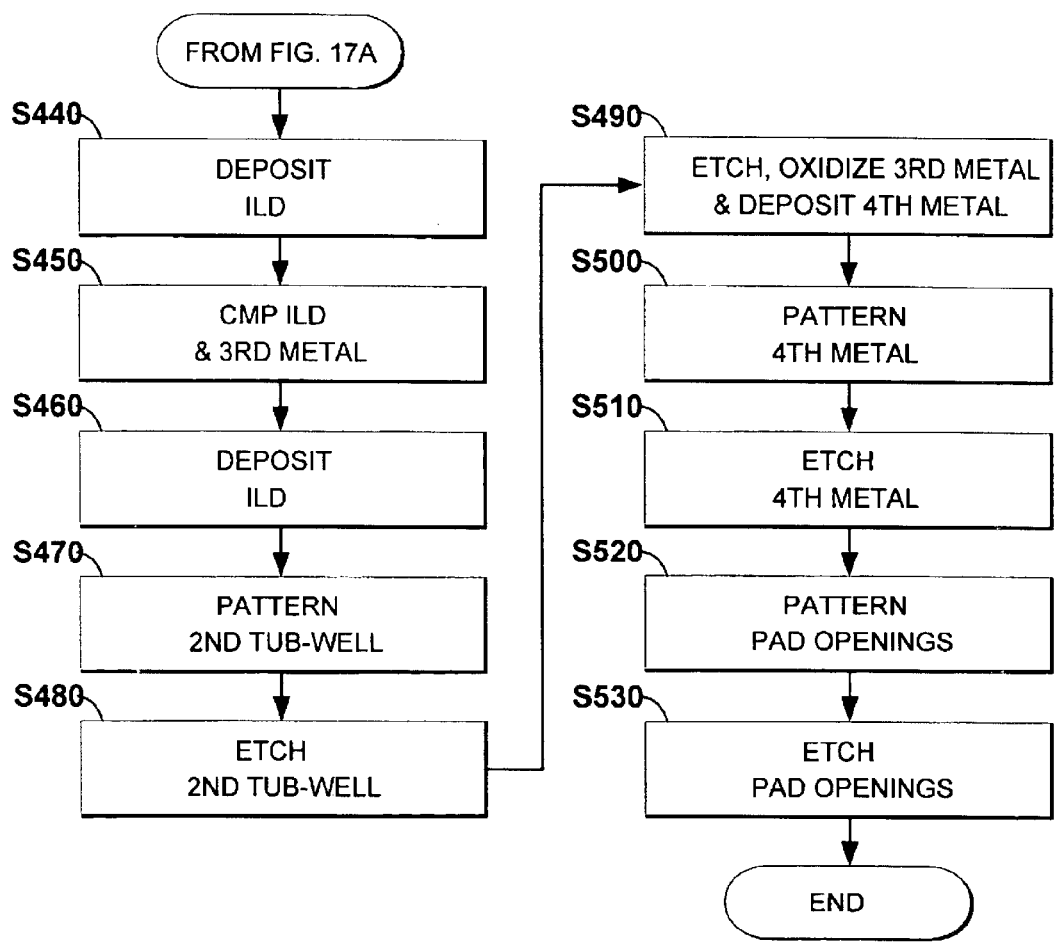
Figure 18F:
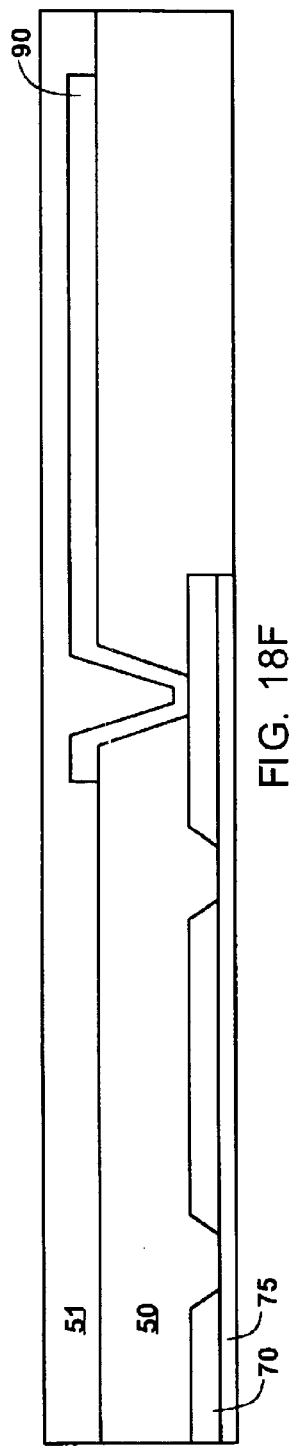
Figure 18G:
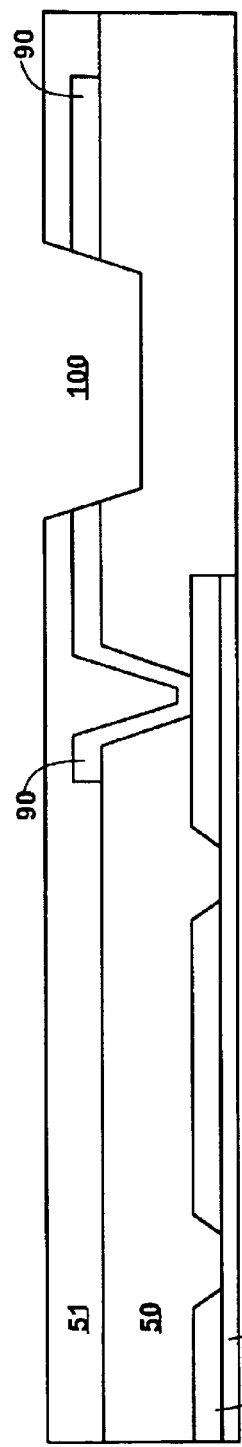

FIGS. 17A and 17B together constitute a flow diagram illustrating another embodiment of a fabrication method performed in accordance with the invention. FIGS. 18A-18K illustrate this method with a series of side elevation cross-sectional views of an embodiment structure at various selected stages of fabrication by the method. As shown in FIGS. 17A and 17B, this method again begins with providing a suitable substrate (step S300). The substrate is indicated by the bottom edge of FIGS. 18A-18K. In step S310, resistive material and a metal layer are deposited (FIG. 18A). The metal layer is patterned (step S320) and etched (step S330). In step S340, resistors are patterned. Step S350 comprises etching the metal layer, exposing resistive material 75 (FIG. 18B). An interlayer dielectric (ILD) is deposited and planarized by chemical-mechanical polishing (CMP) (step S360) (FIG. 18C). In step S370 vias are patterned and etched (FIG. 18D). In step S380, a second metallization layer is deposited. The second metallization layer is patterned (step S390) (FIG. 18E). In step S400 another interlayer dielectric (ILD) is deposited and planarized by chemical-mechanical polishing (CMP) (FIG. 18F). A first tub-well opening is patterned (step S410) and etched by a directional etching process, such as reactive ion etching (step S420) (FIG. 18G). Step S430 combines etching and oxidizing the second metallization layer and depositing a third metallization layer (including depositing the third metallization layer on sloped side-walls of the first tub-well opening), thus forming a tunnel junction 25. Thus, in this method, the effective area of tunnel junction 25 is controlled partially by the thickness of the second metallization layer and partially by the slope angle of sloped side-walls of the first tub-well opening. The third metallization layer may be patterned and etched at this point to further define its lateral extent or to divide the tunnel junction into multiple tunnel-junction devices. Otherwise, this method results in an annular tunnel junction. For simplicity of the drawings, it is assumed for purposes of illustration that tunnel junction 25 is left in its undivided annular form.

Figure 18H:
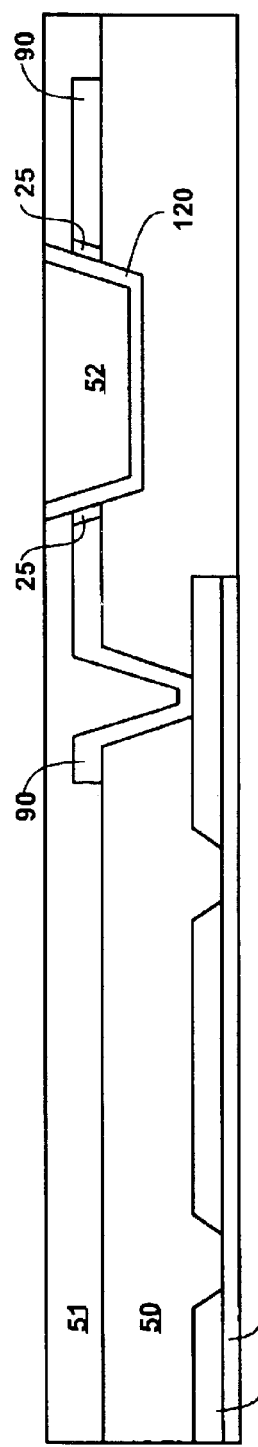
Figure 18I:
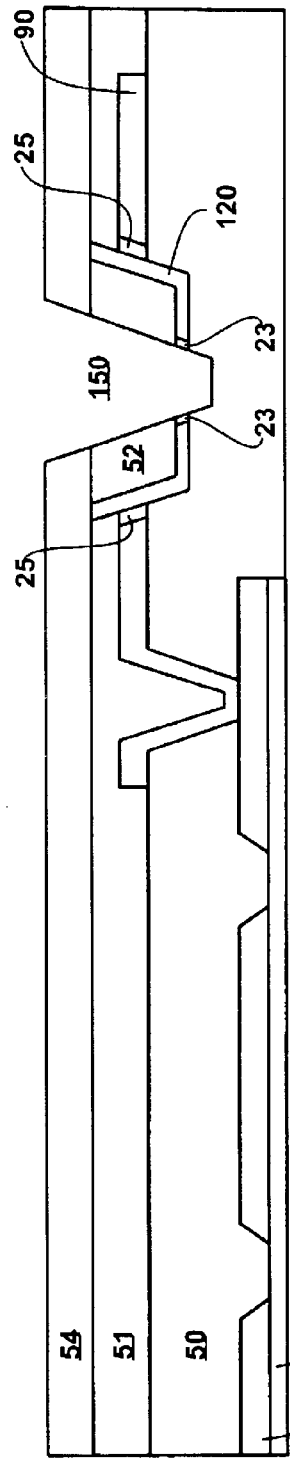

FIG. 17B continues the illustration of this method with the step of depositing another interlayer dielectric (ILD) (step S440). In step S450, that ILD and the third metallization layer together are planarized by chemical-mechanical polishing (CMP) (FIG. 18H). Another ILD is deposited (step S460). A second tub-well opening is patterned (step S470) and etched by a directional etching process, such as reactive ion etching (step S480) (FIG. 18I). Step S490 combines etching and oxidizing the third metallization layer and depositing a fourth metallization layer (including depositing the fourth metallization layer on sloped side-walls of the second tub-well opening), thus forming a tunnel junction 23. Thus, again in this method, the effective area of tunnel junction 23 is controlled partially by the thickness of the third metallization layer and partially by the slope angle of sloped side-walls of the second tub-well opening.

Figure 18J:
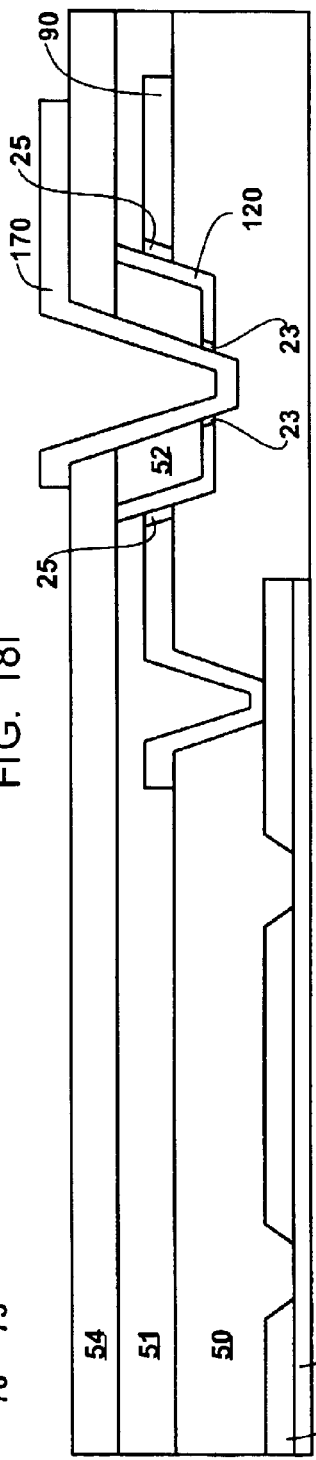

In step S500, the fourth metallization layer is patterned. In step S510, the fourth metallization layer is etched (FIG. 18J). Besides providing for electrical coupling to the tunnel junctions, the fourth metallization layer patterning and etching (steps S500 and S510) may be used to further define the lateral extent of tunnel junction 23, or to divide the tunnel junction into multiple tunnel-junction devices. Otherwise, like tunnel junction 25, this method results in an annular tunnel junction. For simplicity of the drawings, it is assumed for purposes of illustration that tunnel junction 23 is left in its undivided annular form.

Figure 18K:
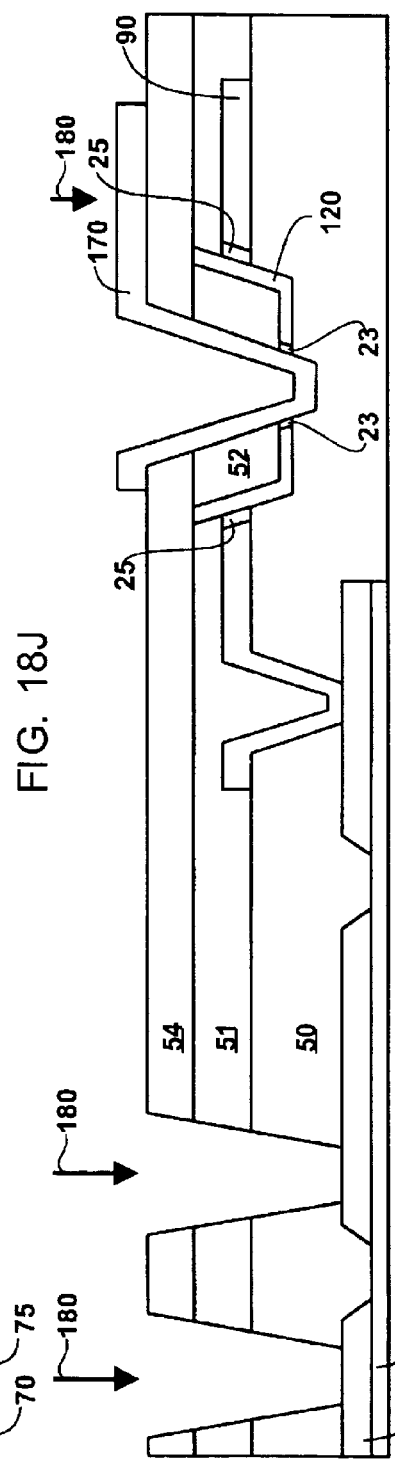

In the last two steps of this method, if required, pad openings are patterned (step S520) and etched (step S530) (FIG. 18K). Vertical arrows 180 in FIG. 18K indicate locations for probing the structure for testing at this stage, if required. Again, the structure thus completed may be used as one layer in fabricating a multi-layer integrated circuit structure, by repeating the various steps described above for each successive integrated circuit layer until the multi-layer integrated circuit structure is complete. It will be understood by those skilled in the art that an interlayer dielectric deposited (and planarized if necessary) to form the top surface of each layer of the multi-layer integrated circuit structure (e.g., after steps S510 or S530) serves as a substrate for the next successive layer. If needed for interlayer connections, openings are formed in that interlayer dielectric and filled with a conductive material such as tungsten to form vias or contact plugs (e.g., as in step S20 or after steps S520 and S530, described hereinabove).

Figure 19:
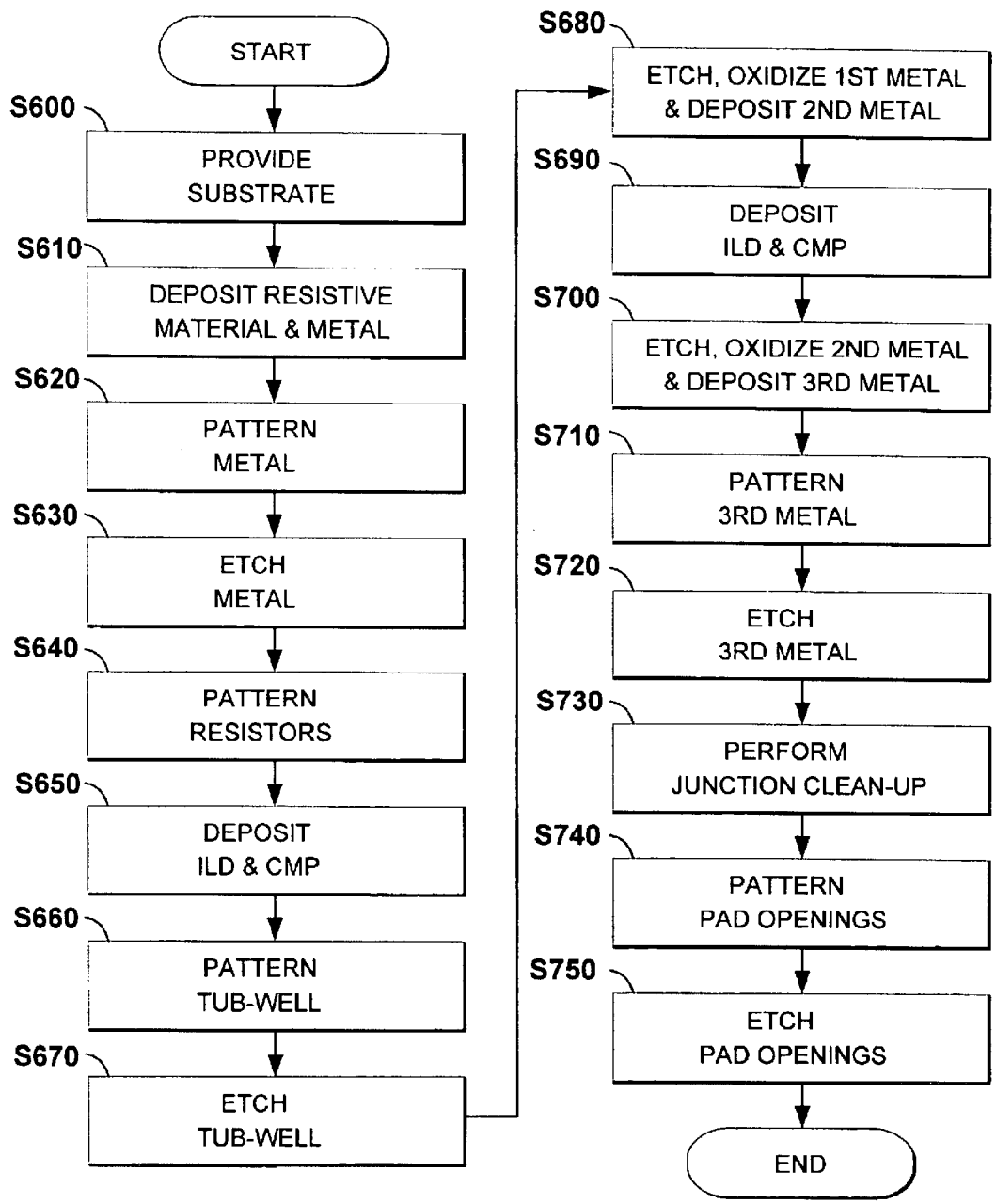
FIG. 19 is a flow chart illustrating another embodiment of a fabrication method performed in accordance with the invention.
Figure 20D:
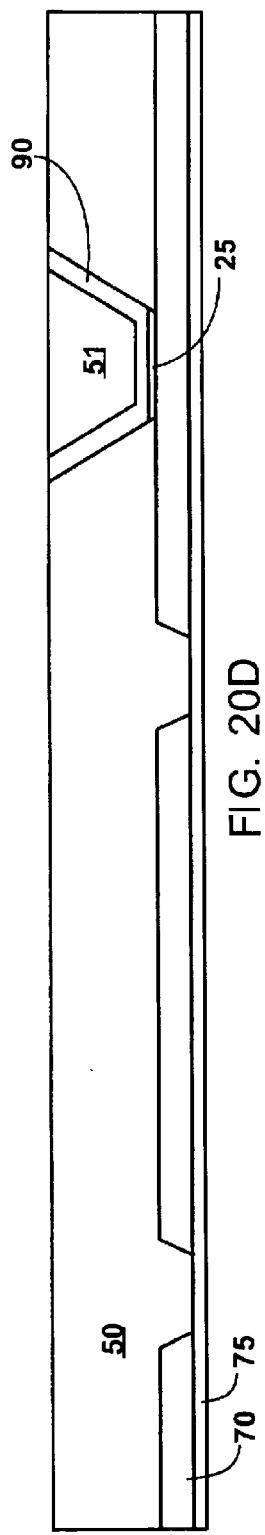
Figure 20E:
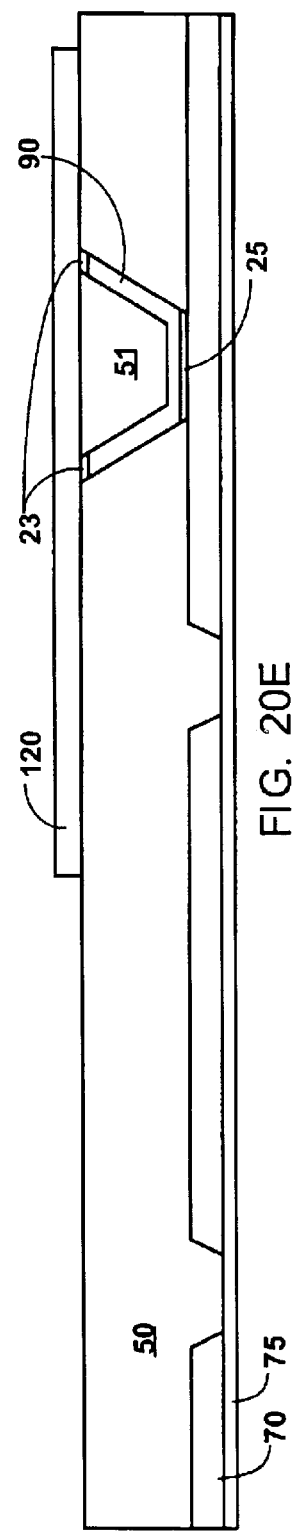
Figure 20F:
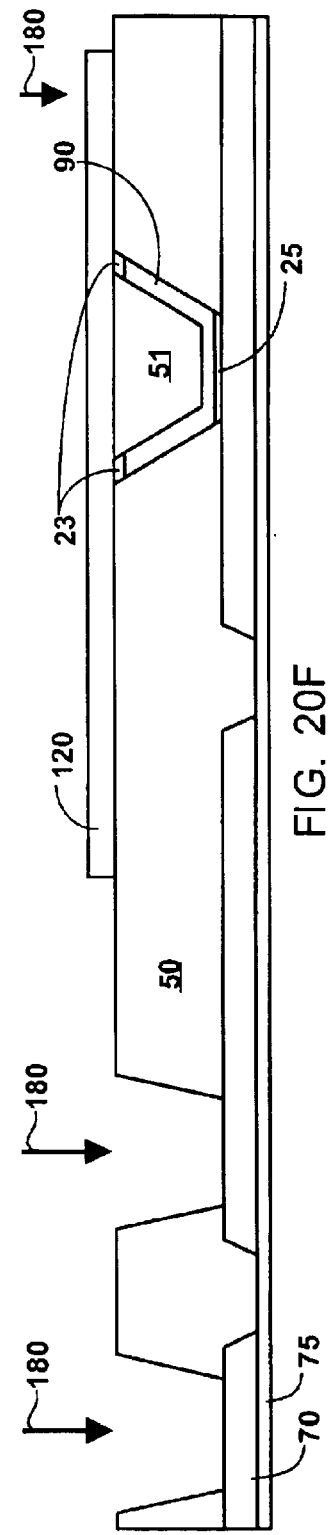

FIG. 19 shows a flow chart, illustrating another embodiment of a fabrication method performed in accordance with the invention. FIGS. 20A-20F are side elevation cross-sectional views of an embodiment structure at various selected stages of fabrication by the method embodiment of FIG. 19. As shown in FIG. 19, this process starts with providing a suitable substrate (step S600). In step S610, a film of resistive material and a first metallization layer are deposited (FIG. 20A). The first metallization layer is patterned (step S620) and etched (step S630). In step S640, resistors are patterned. In step S650, an interlayer dielectric (ILD) is deposited and planarized by CMP. A tub-well opening 100 is patterned (step S660) and etched by a directional etching process, such as reactive ion etching (step S670) (FIG. 20B). Step S680 combines etching and oxidizing the first metallization layer and depositing a second metallization layer, thus forming a tunnel junction 25 at the bottom of tub-well opening 100. In step S690, another interlayer dielectric (ILD) is deposited (FIG. 20C) and planarized by chemical-mechanical polishing (CMP) (FIG. 20D). Step S700 combines etching and oxidizing the second metallization layer and depositing the third metallization layer, thus forming a tunnel junction 23 at the top rim edge of tub-well opening 100. Thus, the bottom of tub-well 100 forms a relatively large-area tunnel junction especially useful as a control element, and the top of tub-well 100 forms a relatively small-area tunnel junction device especially useful as an antifuse storage element. The third metallization layer is patterned (step S710) and etched (step S720) (FIG. 20E). Junction clean-up is performed in step S730. In the last two steps of this method, if required, pad openings are patterned (step S740) and etched (step S750) (FIG. 20F). Vertical arrows 180 in FIG. 20F indicate locations for probing the structure for testing at this stage, if required.

The effective cross-sectional (surface) area of tunnel junction 23 can be controlled further by offsetting the pattern of the subsequent metallization layer conductor to make any desired area ratio with the cross-sectional (surface) area of tunnel junction 25.

Thus, these methods can fabricate a tunnel-junction structure including a tub-well having a bottom surface, a top edge, and a sidewall (extending from the top edge to the bottom surface of the tub-well) and including two tunnel junctions, one or both of which may be disposed at the sidewall of a tub-well. Or, one or both of the tunnel junctions may be disposed at the top edge of a tub-well. Or, one or both of the tunnel junctions may be disposed at the bottom surface of a tub-well. It will be understood by those skilled in the art that two tunnel junctions, whether formed in the same tub-well or in different tub-wells, should be spaced apart from each other. Similarly, two tunnel junctions, whether they are formed at the bottom surface, top edge, or a sidewall of a tub-well, should also be spaced apart from each other. As mentioned hereinabove, the two tunnel junctions formed in any of the methods disclosed may have different effective cross-sectional areas.

INDUSTRIAL APPLICABILITY

The methods of the invention and tunnel-junction structures specially adapted for those methods are useful in single-layer cross-point memory arrays, multiple-layer cross-point memories, so-called "n+1" memory structures, interpillar memory structures, and many other memory systems. The tunnel-junction structures made by the methods disclosed can result in thinner, faster, and lower cost integrated circuits with higher packing density than those using other structures.

Although the foregoing has been a description and illustration of specific embodiments of the invention, various modifications and changes can be made thereto by persons skilled in the art without departing from the scope and spirit of the invention as defined by the following claims. For example, control of tunnel-junction device cross-sectional areas may be achieved by a combination of lithographic methods with those methods illustrated by the embodiments disclosed herein.

What is claimed is:

1. A method for fabricating tunnel-junction structures, said method comprising the steps of:

a) providing a substrate with an insulating surface;

b) depositing and patterning a first metal layer on the insulating surface;

c) depositing a second layer of dielectric over at least a portion of the patterned first metal layer;

d) patterning and forming a first opening through said second layer of dielectric;

e) forming a first oxide layer an said first metal layer;

f) depositing a second metal layer over said first oxide layer, thus forming a first tunnel junction;

g) depositing a third layer of dielectric over at least a portion of the second metal layer;

h) patterning and forming a second opening through at least said third layer of dielectric;

i) forming a second oxide layer on said second metal layer and depositing a third layer of metal, thus forming a second tunnel junction; and j) patterning said third layer of metal, whereby a third metallization layer pattern is formed for electrically coupling to said first and second tunnel junctions.

2. A tunnel-junction structure made in accordance with the method of claim 1.

3. A memory including a tunnel-junction structure made in accordance with the method of claim 1.

4. A storage device including a tunnel-junction structure made in accordance with the method of claim 1.

5. An integrated circuit including a tunnel-junction structure made in accordance with the method of claim 1.

6. A substrate carrying microelectronics, said microelectronics including a tunnel-junction structure made in accordance with the method of claim 1.

7. An electronic device comprising a tunnel-junction structure made in accordance with the method of claim 1.

8. The method of claim 1, wherein said Step of depositing and patterning a first metal layer is performed using a damascene process.

9. A tunnel-junction structure made by the method of claim 8.

10. The method of claim 1, wherein said step of depositing and patterning a first metal layer is performed using a dual damascene process.

11. A tunnel-junction structure made by the method of claim 10.

12. The method of claim 1, further comprising the step of: patterning said second metal layer, thereby forming a second metallization layer pattern.

13. The method of claim 12, wherein said step of patterning said second metal layer is performed using a damascene process.

14. A tunnel-junction structure made by the method of claim 13.

15. The method of claim 12, wherein said step of depositing and patterning said second metal layer is performed using a dual damascene process.

16. A tunnel-junction structure made by the method of claim 15.

17. The method of claim 12, wherein said second-metal-layer patterning step includes offsetting said second metallization layer pattern of said second metal layer laterally with respect to said first opening.

18. The method of claim 1, wherein said third-metal-layer patterning step includes offsetting said third metallization layer pattern of said third metal layer laterally with respect to said second opening.

19. The method of claim 1, wherein said third-metal-layer patterning step is performed using a damascene process.

20. A tunnel-junction structure made by the method of claim 19.

21. The method of claim 1, wherein the third-metal-layer patterning step is performed using a dual damascene process.

22. A tunnel-junction structure made by the method of claim 21.

23. The method of claim 1, wherein said step of patterning and forming said first opening includes forming sloped sidewalls of said first opening.

24. The method of claim 1, wherein said step of patterning and forming said first opening induces forming said first opening by directional etching.

25. The method of claim 24, wherein said directional etching is performed by reactive ion etching.

26. A tunnel-junction structure made by the method of claim 24.

27. The method of claim 1, wherein said step of patterning and forming said second opening includes forming said first opening by directional etching.

28. The method of claim 27, wherein said directional etching is performed by reactive ion etching.

29. A tunnel-junction structure made by the method of claim 27.

30. A method for fabricating a multi-layer integrated circuit structure, said method comprising the steps of:

i) performing the steps a) through j) of claim 1 to fabricate a first integrated circuit layer, whereby a substrate is formed for a second integrated circuit layer; and then ii) repeating steps b) through j) of claim 1 for the second integrated circuit layer and again for each successive integrated circuit layer until a desired number of integrated circuit layers is reached, whereby said multi-layer integrated circuit structure is completed.

31. A memory including a multi-layer integrated circuit structure made in accordance with the method of claim 30.

32. A storage device including a multi-layer integrated circuit structure made in accordance with the method of claim 30.

33. An integrated circuit including a multi-layer integrated circuit structure made in accordance with the method of claim 30.

34. A substrate carrying microelectronics, said microelectronics including a multi-layer integrated circuit structure made in accordance with the method of claim 30.

35. An electronic device comprising a multi-layer integrated circuit structure made in accordance with the method of claim 30.

36. A method for fabricating tunnel-junction structures, said method comprising the steps of:

a) providing a substrate with an insulating surface;

b) forming contact plug openings and filling said contact plug openings with conductive material;

c) depositing a first interlayer dielectric;

d) patterning and forming openings through said first interlayer dielectric, depositing and patterning a first metallization layer and first vias;

e) planarizing a resulting surface;

f) depositing and patterning a second metallization layer;

g) depositing a second interlayer dielectric;

h) patterning and forming a first opening through said second interlayer dielectric;

i) forming a first thin oxide layer on said first metallization layer;

j) depositing a conductive material over said first thin oxide layer, thus forming a tunnel junction;

k) depositing a dielectric material, at least filling said first opening, and planarizing the resulting surface;

l) depositing a phase-change layer;

m) depositing and patterning a third metallization layer;

n) depositing a third interlayer dielectric and forming second via openings through said third interlayer dielectric;

o) filling said second via openings with conductive material;

p) planarizing the resulting surface;

q) depositing and patterning a fourth metallization layer; and r) depositing a fourth interlayer dielectric.

37. A tunnel-junction structure made by the method of claim 36.

38. The method of claim 36, wherein at least one of said first-, second-, third- and fourth-metallization-layer depositing and patterning stops is performed by a damascene process.

39. A tunnel-junction structure made by the method of claim 38.

40. The method of claim 36, wherein at least one of said first-, second-, third- and fourth-metallization-layer depositing and patterning steps is performed by a dual damascene process.

41. A tunnel-junction structure made by the method of claim 40.

42. A memory including a tunnel-junction structure made in accordance with the method of claim 40.

43. A storage device including a tunnel-junction structure made in accordance with the method of claim 40.

44. An integrated circuit including a tunnel-junction structure made in accordance with the method of claim 40.

45. A substrate carrying microelectronics, said microelectronics including a tunnel-junction structure made in accordance with the method of claim 40.

46. An electronic device comprising a tunnel-junction structure made in accordance with the method of claim 40.

47. A method for fabricating a multi-layer integrated circuit structure, said method comprising the steps of:
  i) first performing the steps a) through r) of claim 36 to fabricate a first integrated circuit layer, whereby a substrate is formed for a second integrated circuit layer; and then
  ii) repeating steps b) through r) of claim 36 for the second integrated circuit layer and again for each successive integrated circuit layer until a desired number of integrated circuit layers is reached, whereby said multi-layer integrated circuit structure is completed.

48. A multi-layer integrated circuit structure made by the method of claim 47.

49. A memory including a multi-layer integrated circuit structure made in accordance with the method of claim 47.

50. A storage device including a multi-layer integrated circuit structure made in accordance with the method of claim 47.

51. An integrated circuit including multi-layer integrated circuit structure made in accordance with the method of claim 47.

52. A substrate carrying microelectronics, said microelectronics including a multi-layer integrated circuit structure made in accordance with the method of claim 47.

53. An electronic device comprising a multi-layer integrated-circuit structure made in accordance with the method of claim 47.

* * * * *

UNITED STATES PATENT AND TRADEMARK OFFICE
CERTIFICATE OF CORRECTION

PATENT NO. : 6,821,848 B2  Page 1 of 1
APPLICATION NO. : 10/286157
DATED : November 23, 2004
INVENTOR(S) : Dennis Lazaroff et al.

It is certified that error appears in the above-identified patent and that said Letters Patent is hereby corrected as shown below:

Column 2, line 16, delete "ma" and insert therefor --may--

Column 3, line 10, delete "d posited" and insert therefor --deposited--

Column 6, Claim 1, line 55, delete "a) providing a substrate with an insulating surface:" and insert therefor --a) providing a substrate and, if necessary, depositing a first layer of dielectric on the substrate to provide an insulating surface;--.

Column 7, Claim 8, line 20, delete "Step" and insert therefor --step--

Column 8, Claim 30, line 9, delete "i) performing" and insert therefor --i) first performing--

Signed and Sealed this

Fifth Day of September, 2006

JON W. DUDAS
*Director of the United States Patent and Trademark Office*